United States Patent
Shin et al.

(10) Patent No.: US 9,251,309 B2
(45) Date of Patent: Feb. 2, 2016

(54) COST-OPTIMIZED MODEL-BASED EXTENSION OF SYSTEM LIFE

(75) Inventors: Kwang-Keun Shin, Rochester Hills, MI (US); Mutasim A. Salman, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 960 days.

(21) Appl. No.: 13/238,144

(22) Filed: Sep. 21, 2011

(65) Prior Publication Data

US 2013/0073222 A1     Mar. 21, 2013

(51) Int. Cl.
*G01B 3/44* (2006.01)
*G06F 19/00* (2011.01)
*G06F 17/50* (2006.01)

(52) U.S. Cl.
CPC ............... *G06F 19/00* (2013.01); *G06F 17/50* (2013.01); *Y02T 10/56* (2013.01)

(58) Field of Classification Search
CPC .......... G06F 19/00; G06F 17/50; Y02T 10/56
USPC ..................................... 702/34, 35
See application file for complete search history.

(56) References Cited

U.S. PATENT DOCUMENTS

| | | | |
|---|---|---|---|
| 5,798,577 A * | 8/1998 | Lesesky et al. | 307/10.7 |
| 6,260,004 B1 * | 7/2001 | Hays et al. | 702/183 |
| 2002/0044296 A1 * | 4/2002 | Skaanning | 358/1.14 |
| 2005/0091018 A1 * | 4/2005 | Craft | 703/8 |
| 2006/0282362 A1 * | 12/2006 | Nasr et al. | 705/35 |
| 2010/0274631 A1 * | 10/2010 | McFall et al. | 705/10 |

OTHER PUBLICATIONS

Stewart, M., Estes, A., and Frangopol, D. (2004). "Bridge Deck Replacement for Minimum Expected Cost Under Multiple Reliability Constraints." J. Struct. Eng., 130(9), 1414-1419.*

Allen C. Estes and Dan M. Frangopol. "Minimim Expected Cost-Oriented Optimal Maintenance Planning for Deteriorating Structures: Application to Concrete Bridge Decks" Reliability Engineering & System Safety 73.3 (2001): 281-291.*

(Continued)

*Primary Examiner* — Sujoy Kundu
*Assistant Examiner* — Yoshihisa Ishizuka
(74) *Attorney, Agent, or Firm* — Quinn Law Group, PLLC

(57) ABSTRACT

A method includes recording a current performance signature for first and second components in a system, recording a calibrated baseline performance signature for the components, and processing the performance signatures through an aging model to determine a future performance signature for each component. The future performance signatures are processed through a system function model to determine the state of function of the system for each possible repair case. A cost-optimal repair case is then determined from among the possible repair cases, and recorded in memory. An apparatus includes first and second components of a system, and a host machine configured for processing the current and baseline performance signatures through the aging and system function models as noted above. The cost-optimal repair case is determined from among all possible repair cases, and then recorded in memory. An example system may be a cranking system with a starter motor and battery.

7 Claims, 3 Drawing Sheets

(56) References Cited

OTHER PUBLICATIONS

Hartmann, Mark., Finding Minimum Cost to Time Ratio Cycles with Small Integral Transit Times, Networks, vol. 23 (1993) 567-574 © 1993 by John Wiley & Sons, Inc.*

Sampath Srinivas, Modeling Techiniques and algorithms for probabilistic model-based diagnosis and repair, A dissertation submitted to the department of Computer Science and the Commitee on graduate studies of Stanford University, In partial fulfillment of the requirements for the degree of Doctor of Philosophy, Jul. 1995.*

* cited by examiner

| # | 12 | 14 | F(t) | F($t_f$) | $ | RUL |
|---|----|----|------|----------|---|-----|
| 0 | 0 | 0 | $F_0(t)$ | $F_0(t_f)$ | 0 | $RUL_0$ |
| 1 | 1 | 0 | $F_1(t)$ | $F_1(t_f)$ | $\$_1$ | $RUL_1$ |
| 2 | 0 | 1 | $F_2(t)$ | $F_2(t_f)$ | $\$_2$ | $RUL_2$ |
| 3 | 1 | 1 | $F_3(t)$ | $F_3(t_f)$ | $\$_3$ | $RUL_3$ |

COST-OPTIMIZED MODEL-BASED EXTENSION OF SYSTEM LIFE

TECHNICAL FIELD

The present disclosure relates to a cost-optimized model-based method and apparatus for extending the life of a system having multiple components.

BACKGROUND

A system is a set of interacting or interdependent components forming an integrated whole. Over time, the performance of the various components comprising the system can degrade at different rates. Because the role and cost of each component can widely differ, the degradation in performance of a given component over time can have a unique impact on the functional state of the system relative to other components used in the same system. Therefore, it can be a challenge to precisely identify the most cost-optimal component(s) in a system to repair or replace.

SUMMARY

An aging model and a system function model are used as disclosed herein to determine the particular component(s) of a system that should be repaired or replaced to provide a cost-optimized extension of the system's working life. Cost optimization may consider the user's desired system life, e.g., how much longer the user intends to own and operate a particular vehicle or other system. In this manner, the present method can avoid recommending a repair solution providing five years of operating life at a higher total cost to a user who intends to own and operate that system for only one more year.

A system's state of function (SOF) depends of the state of health (SOH) of each component comprising that particular system. The effect of SOH of each component is synergistic, i.e., the SOF of the system can be zero even when the SOH of the components remains above zero. Therefore, SOF may be estimated or predicted for a system based on all possible repair cases, i.e., repair/replacement of some, all, or none of the components, with each repair case considered in turn. As noted above, such analysis may also consider the user's desired system life, for instance a desired end of service of a vehicle.

In particular, the present method includes recording current and new/calibrated baseline performance signatures for each component used in a system, and then processing the current and calibrated baseline performance signatures through an aging model to determine a future performance signature for each component. The method includes processing the future performance signatures for the current and calibrated baseline components through a system function model to determine the SOF of the system for each possible repair case, with $2^n-1$ repair cases being possible for an n-component system. The method further includes calculating the cost-optimal repair case of the n cases, and recording this case in memory, e.g., of a data recorder or a host machine in communication with the components and/or data recorder. Determination of cost optimal repairs may include determining the user's desired end of life of the system, with the cost optimized recommendations taking into account the desired end of life.

An apparatus includes at least first and second components and a host machine in communication with the first and second components. The host machine includes an aging model and a system function model, e.g., programmed in tangible, non-transitory memory. The host machine is configured for receiving current and calibrated baseline performance signatures for each of the first and second components, and processing the current and calibrated baseline performance signatures through the aging model to determine a future performance signature for each of the first and second components.

The host machine also processes the future performance signatures through the system function model to determine an SOF of the system for each possible repair case, wherein each possible repair case describes a possible repair combination of the first and second components, and calculates a cost-optimal repair case from among the possible repair cases. As noted above, the cost-optimal repair case may consider the user's desired end of service life for the system. The cost-optimal repair case may be recorded in memory for later extraction, such as by a maintenance person when performing the repair case.

The above features and advantages and other features and advantages of the present disclosure are readily apparent from the following detailed description of the best modes for carrying out the disclosure when taken in connection with the accompanying drawings.

DETAILED DESCRIPTION

Figure 1:
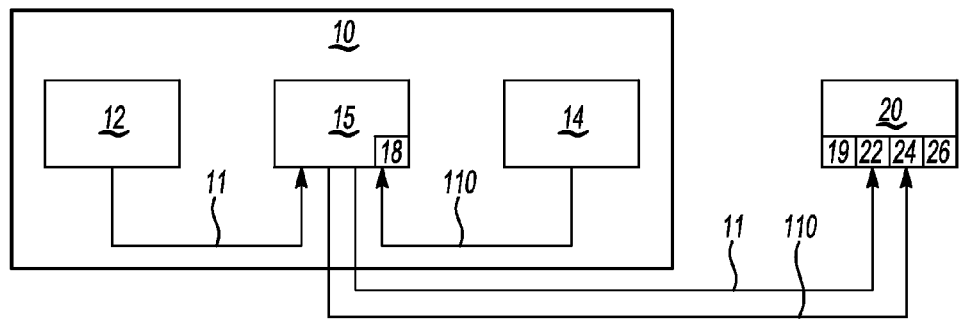
FIG. 1 is a schematic illustration of an example system having a pair of components.

Referring to the Figures, wherein like reference numerals refer to like elements, an example system 10 is shown having a pair of components, i.e., a first component 12 and a second component 14 in communication with a host machine 20. For simplicity, only two components are used in the following examples, however those of ordinary skill in the art will appreciate that any plurality (n) of components could be used without departing from the intended inventive scope.

In a particular non-limiting embodiment, the system 10 of FIG. 1 may be configured as a vehicle cranking system. In such an embodiment, the first component 12 may be a starter motor and the second component 14 may be a battery. Cranking function may degrade over time based on the gradual degradation of the battery, the starter motor, or both components. To recover some of the lost cranking function in this example or a lost system state of function (SOF) in any other system, one or both of the components 12 and 14 can be repaired or replaced. The present approach considers the repair costs versus life extension for each of the $2^n-1$ possible repair/replacement cases, hereinafter referred to as repair cases for simplicity. The resultant SOF for the system 10 resulting from each repair case is then predicted to thereby determine which component(s) should be repaired/replaced.

Within the system 10, an optional data recorder 15 may be used to record, in tangible/non-transitory memory 18, a current performance signature (arrows 11, 110) for the respective components 12 and 14. Recording via the data recorder 15 may be continuous or periodic depending on the embodiment. Recorded values may include power consumption, speed, fault data, or any other information which sufficiently describes the current or present performance of that particular component. In other embodiments, the data recorder 15 may be omitted and the current performance signatures (arrows 11, 110) for the respective components 12 and 14 may be transmitted or streamed to the host machine 20.

The host machine 20 may be located remotely from the system 10 in wireless communication therewith, or positioned with the system 10, e.g., as a vehicle controller aboard the same vehicle as the system 10 when the system 10 is configured as a vehicular system. The host machine 20 receives the current performance signatures (arrows 11, 110) as they are extracted from the first and second components 12 and 14, e.g., via sensors 25 (see FIG. 3). The host machine 20 may measure and record for later use the calibrated new/repaired signatures from new or validated/repaired components. The use of these calibrated signals will be explained in more detail below with reference to FIG. 5.

Figures 4, 5:
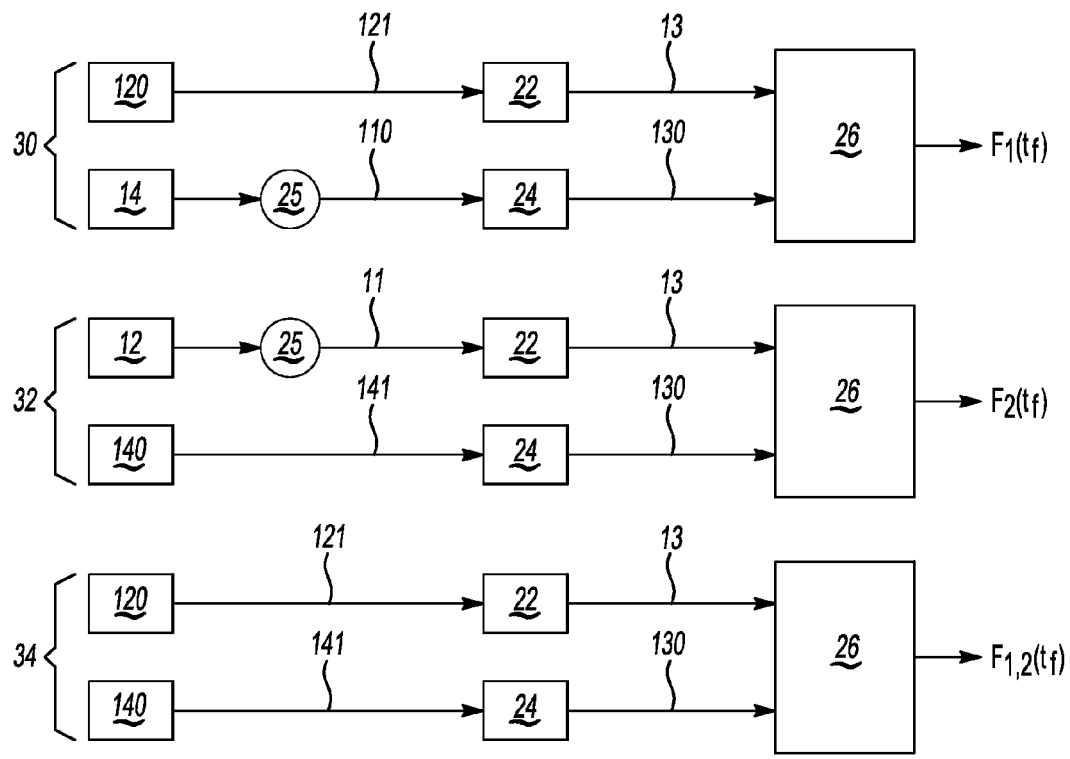
FIG. 4 is a table describing example repair cases.
FIG. 5 is another block flow diagram showing various predicted system functions for different example repair scenarios.

The host machine 20 may include such common elements as a microprocessor or a central processing unit (CPU), memory including but not limited to: tangible/non-transitory memory on which is recorded instructions which embody the present method 100 of FIG. 5, read only memory (ROM), random access memory (RAM), electrically-erasable programmable read-only memory (EEPROM), flash memory, etc. Additionally, the host machine 20 may include circuitry including but not limited to a high-speed clock, analog-to-digital (A/D) circuitry, digital-to-analog (D/A) circuitry, a digital signal processor, and any necessary input/output (I/O) devices and other signal conditioning and/or buffer circuitry.

The host machine 20 includes an aging model 22 for the first component 12 and an aging model 24 for the second component 14, which may be recorded as curves, formulas, lookup tables, etc., in tangible/non-transitory memory 19. Where more components are used, additional aging models will be present. As used herein, the term "aging model" refers to any device which predicts the degradation or deterioration of a component. The host machine 20 also includes a system function model 26 in communication with the aging models 22 and 24. The system function model 26 can therefore processes information generated by the aging models 22 and 24, as well as directly processing the current performance signatures (arrow 11) for each component 12 and 14.

Figure 2:
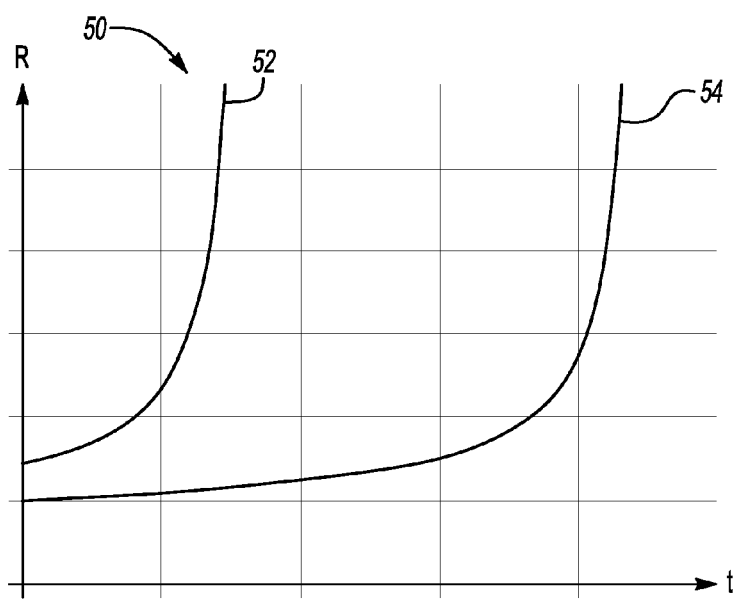
FIG. 2 is an example time plot usable in the aging model shown in FIG. 1.

Referring to FIG. 2, an example sub-model 50 may be used as part of the aging model 22 of FIG. 1. Trace 52 represents the performance of an existing component, in this instance a battery, and trace 54 represents the performance of a new battery. The vertical axis (R) represents battery resistance. The horizontal axis represents time (t), e.g., in months. Similar sub-models may exist for other components or other parameters for a given component, e.g., a starter motor with resistance or back-electromagnetic force (EMF) plotted on the vertical axis. By measuring the required parameter, and by knowing the past performance of the same component in similar vehicles over time, the trajectory of trace 52 can be predicted and thus modeled.

Figure 3:
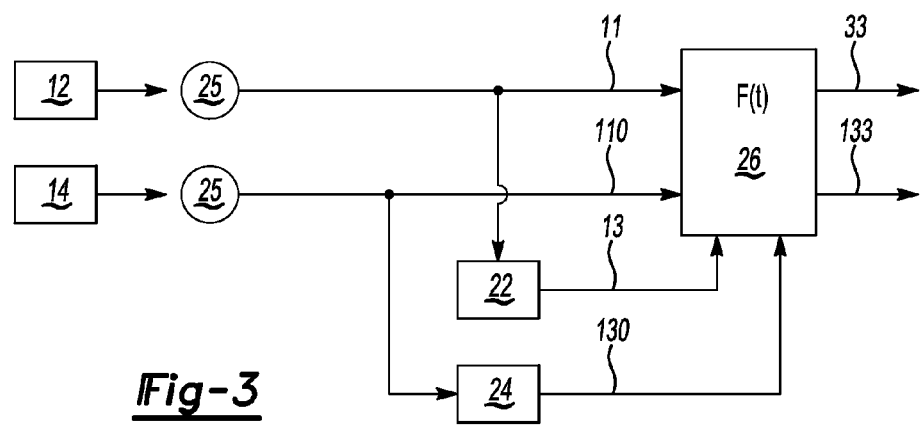
FIG. 3 is a block flow diagram showing the various components of the model-based approach for determining which of the components of a system to repair/replace.

Referring to FIG. 3, the flow of information between the monitored system 10 of FIG. 1 and the host machine 20 is shown in a block diagram format. Sensors 25 using signature extraction logic may be used to extract the current performance signatures (arrows 11, 110) for first and second components 12 and 14, respectively. The current performance signatures (arrows 11, 110) are ultimately transmitted to the host machine 20, e.g., via a telematics unit, via a maintenance probe applied to data recorder 15 of FIG. 1, flash memory device, or otherwise.

Once received by the host machine 20, the current performance signatures (arrows 11, 110) are processed through the aging models 22, 24. Such aging models 22, 24 may include historic maintenance or statistical data describing the past performance of substantially similar components 12, 14, for instance the same model of component used in a reference test, validation, or prior fielded system. Such data may be in the form of lookup tables, performance curves, formulas, or any other suitable data format.

The system function model 26 processes the current performance signatures (arrows 11, 110) and the future performance signatures (arrows 13, 130) for the respective components 12, 14 to thereby generate corresponding current system state of function (SOF)(arrow 33) and future SOF (arrow 133). From these values the host machine 20 can identify the components 12 and/or 14 to repair/replace in order to produce the most cost efficient result with respect to the extension of useful operating life.

In an example cranking system, maximum motor torque may be represented as:

$$\frac{K_m V_o}{R_b + R_m}$$

where $K_m$ is the back-EMF for the motor, $R_b$ is the battery resistance, $R_m$ is the motor resistance, and $V_o$ is the battery open-circuit voltage. Maximum/peak engine counter torque is $\tau_e^p$, and the condition for cranking success is $$\frac{K_m V_o}{R_b + R_m} > \tau_e^p.$$

The SOF for the cranking system described in this manner is:

$$SOF = \frac{\frac{K_m V_o}{(R_b + R_m)} - \tau_e^p}{\frac{K_m^o V_o}{(R_b^o + R_m^o)} - \tau_e^p} \times 100\%$$

with the calibrated original values being the denominator, such that SOF=1 and degrades to 0 over time.

Referring to FIG. 4, three different example repair cases are shown for the two-component illustrative system 10 of FIG. 1. With n components, the actual number (#) of repair cases is $2^n-1$. For repair case 0, neither of the components 12 and 14 is replaced. Component 12 is replaced in repair case 1, and component 14 is replaced in case 2. In repair case 3, both components 12 and 14 are replaced.

In repair cases 1-3, the SOF at the time of repair is represented by $F_0(t)$, $F_1(t)$, $F_2(t)$, and $F_3(t)$, respectively, and the respective SOF at the end of the system service life for each case is $F_0(t_f)$, $F_1(t_f)$, $F_2(t_f)$, and $F_3(t_f)$. Here, the system service life may be calibrated, or it may be selected based on a user's desired system service life, e.g., a user having a vehicle that the user wishes to drive for a set period of time before selling or trading in the vehicle. The repair cost ($) is 0 for repair case 0, as although the system 10 may fail to work, nothing is actually replaced or repaired. The remaining useful life (RUL) is determined via the host machine 20 for the various cases 0-3 as $RUL_0$, $RUL_1$, $RUL_2$, and $RUL_3$. Thus, repair costs ($) and RUL is calculated for each repair case, with RUL determined via processing through the models 22, 24, and 26. The host machine 20 can then use a ratio of repair cost and RUL to determine the most cost-efficient repair, e.g., within the time remaining in the desired system service life from among the various possible repair cases 0-3.

Referring to FIG. 5, three different example repair cases 30, 32, and 34 are presented. The first repair case 30 repairs or replaces the first component 12 with a new/calibrated baseline component 120 and continues to use the existing second component 14. The second repair case 32 repairs or replaces the second component 14 with a new/calibrated baseline component 140 while continuing to use the existing first component 12. Similarly, the third repair case 34 replaces both components 12 and 14 with components 120 and 140.

In the example repair case 30, signature extraction occurs via the sensors 25 or using other means results in the current performance signature (arrow 110) of the existing second component 14 being fed into the aging model 24 for that particular component. The new performance signature (arrow 121) of the new first component 120, which can be determined offline using similar sensors 25 and recorded for use when conducting the present method, is fed to the aging model 22 for the first component 12. The same approach occurs in the second example repair case 32, i.e., with the new performance signature (arrow 141) being used for the new second component 140. Likewise, new performance signatures (arrows 121 and 141) of both components 120 and 140 are used in the third repair case 34.

In each case 30, 32, 34, the future signatures for the existing or repaired/replaced components are fed into the system function model 26. In the first repair case 30, i.e., wherein the first component 12 is replaced, the SOF of the system 10 is $F_1(t_f)$. In the second repair case 32, i.e., when the second component 14 is replaced, the SOF of the system 10 is $F_2(t_f)$. In the third repair case 34, i.e., when both components 12 and 14 are replaced, the SOF of system 10 is $F_{1,2}(t_f)$.

As is understood in the art, a system's state of function (SOF) may be represented as follows:

$$F(t)=F\{\theta_1(t),\theta_2(t),\theta_3(t),\ldots,\theta_n(t)\}$$

where $\theta$ represents the signature of the state of health (SOH) of a respective component 1, 2, 3, . . . n. In a component aging model such as models 22 and 24 of FIG. 2, the following mathematical equation applies:

$$\theta i(t_f)=\Phi(t_f,t)\theta i(t).$$

where (i) is the component, $t_f$ is the time at the end of service life of component (i), and $\Phi$ is a function which represents the aging of component (i).

Two different prognosis strategies may be applied. The first is implemented when the present time ($t_k$) is less than the end of service life ($t_f$) for a particular component. This strategy may be implemented to guarantee service life and to choose a repair case that has a minimum cost within the desired service life/time until end of life for the system. The second may be implemented when the end of service life has already been reached, i.e., $t_f<t_k$. This strategy can help maximize RUL with minimal repair costs.

Figure 6:
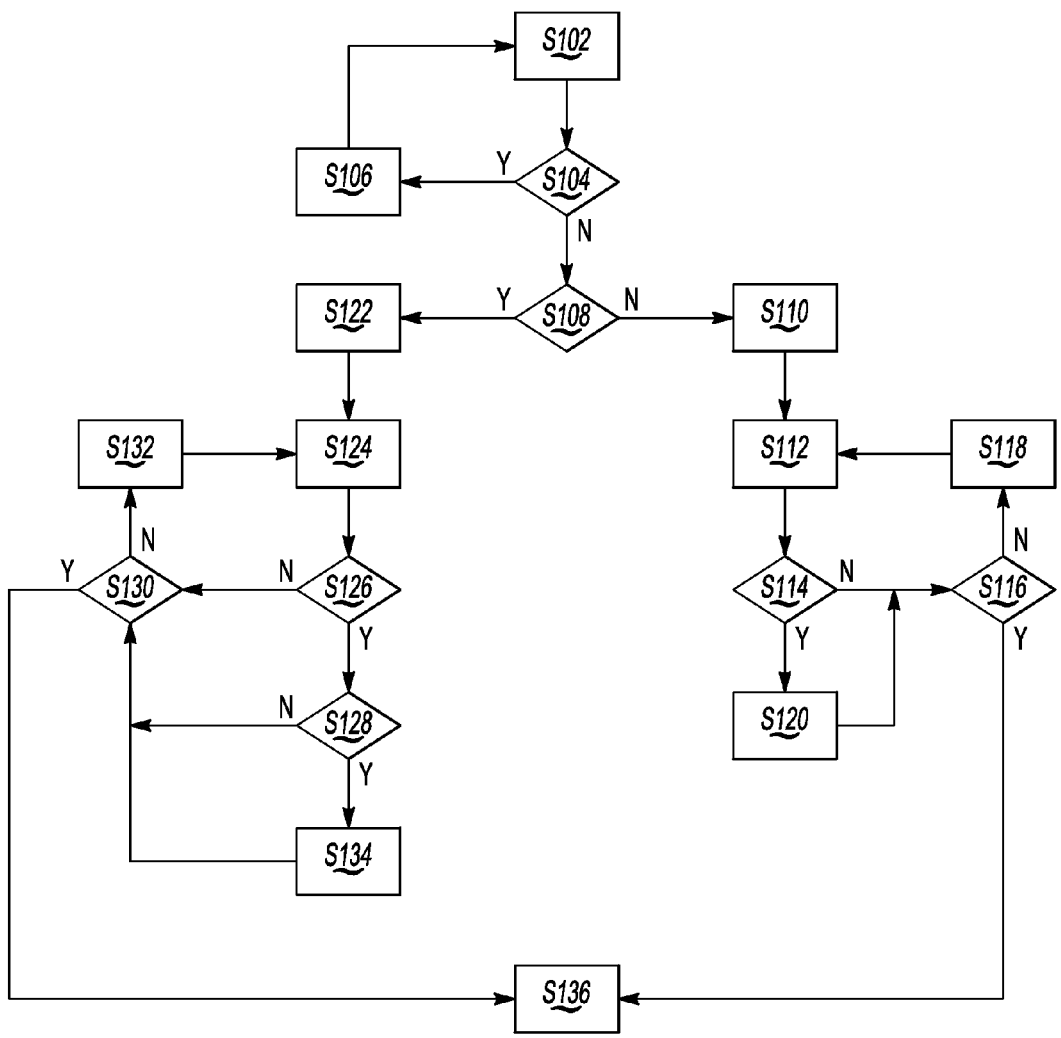
FIG. 6 is a flow chart describing a model-based method for determining which components to repair/replace in a system such as the example system of FIG. 1.

Referring to FIG. 6, an example cost-optimized method 100 is presented for extending the life of a system, e.g., the system 10 shown in FIG. 1. As before, a two-component system will be described for simplicity.

Beginning at step S102, the present state of function (SOF) of the system 10 is calculated or estimated using the system function model 26 of FIG. 2. The SOF from step S102 is then evaluated at step S104 to determine if the SOF exceeds zero. If so, at step S106 the data recorder 15 records a suitable flag or other value, and awaits the next measurement cycle. However, if at step S104 it is determined that SOF is zero, the method 100 proceeds instead to step S108.

At step S108, the host machine 20 determines if the present time ($t_k$) is less than end of life ($t_f$), i.e., if the system 10 is still operating within its expected service life. If so, the method 100 proceeds to step 122. If the system 10 is operating beyond its service life, the method 100 proceeds instead to step S110.

At step S110, having determined at step S108 that the system 10 is beyond its useful service life, the host machine 20 sets k=1 and sets a ratio value $(\$/RUL)_{min}=(\$/RUL)_{max}$, i.e., the cost of repairing/replacing both components divided by the RUL if such a repair were in fact to be made. The method 100 then proceeds to step S112.

At step S112, the host machine 20 calculates the value ($/RUL) for the first repair case (k=1) where the first component 12 is replaced or repaired, and then proceeds to step S114.

At step S114, the value from step S112 is compared to the value set at step S110. If ($/RUL) for k=1 is less than $(\$/RUL)_{min}$ set at step S110, the method 100 proceeds to step S120, otherwise the method 100 proceeds to step S116.

At step S116, the host machine 20 determines if k equals or exceeds the value $2^n-1$. If so, the method 100 proceeds to step S136. If not, the method 100 proceeds to step S118.

At step S118, the host machine 20 increments k, i.e., k=k+1, and repeats step S112 with the new value of k.

At step S120, the host machine 20 sets the value $(\$/RUL)_{min}=(\$/RUL)$ for k=1, then proceeds to step S116.

At step S122, the host machine 20 sets k=1 for the first repair case, sets a value $min equal to a maximum calibrated value corresponding to repair of all components in the system 10, or the effective replacement of the entire system 10.

At step S124, the host machine 20 next calculates the SOF for repair case 1 (see FIG. 4) and at step S126 determines if this value exceeds zero. If the value from step S126 exceeds zero, the method 100 proceeds to step S128, and otherwise proceeds to step S130.

At step S128, the host machine 20 determines if $k<$min, and proceeds to step S134 if it is. That is, the host machine 20 determines if the cost for the present repair case equals or exceeds the recorded minimum cost. If so, the method 100 proceeds to step S134. Otherwise, the method 100 proceeds to step S130.

At step S130, the host machine 20 determines if k equals or exceeds $2^n-1$, or in this example, whether k≥3. If so, the method 100 proceeds to step S136, otherwise the method proceeds to step S132.

At step S132, the value k is incremented, i.e., k=k+1, such that the method 100 continues with repair case 2. The method 100 proceeds with step S124 once k has been incremented.

At step S134, the value $min is set to the cost to repair the first component for repair case 1, and the method 100 proceeds to step S130.

At step 136, the host machine 20 returns the selected repair case as a recommended action. In one example, the cost of battery replacement is $100.00, and provides 20 additional months of life, for a cost rate of $5/month. Replacement of a starter motor is $300, and provides 36 more months of life, or $8.30/month. However, repairing/replacing both the battery and the starter motor is $350.00, but provides 80 months of life due to a synergistic effect, which costs only $4.375/ month. In this example scenario, the host machine 20 could select the third repair case, i.e., repairing/replacing both the battery and the motor. The decision may be based on the user's stated desired end of life of the system. For instance, if the desired end of life is relatively short, e.g., 10 months, this value may be recorded via the host machine 20, and the host machine 20 can calculate a repair which is cost-optimal over the recorded desired system life. That is, it may be more cost effective with respect to a user's particular timeframe to replace only the battery, while another user having a longer desired system life could opt for the repair of both components.

While the best modes for carrying out the disclosure have been described in detail, those familiar with the art to which this disclosure relates will recognize various alternative designs and embodiments for practicing the disclosure within the scope of the appended claims.

The invention claimed is:

1. A method comprising:
   receiving, from a plurality of sensors via a host machine in communication with a system having a plurality n of components, a current performance signature for the plurality n of components, wherein the plurality n includes a first and a second component, and wherein the host machine includes a processor and memory on which is recorded an aging model and a system function model;
   recording, via the host machine, a calibrated baseline performance signature for the first and the second components;
   processing the current and calibrated baseline performance signatures through the aging model to determine a future performance signature for each of the first and second components, including comparing the current and calibrated baseline performance signatures to a recorded trace of past performance values for additional first and second components in a prior-fielded system over time;
   processing the future performance signatures for the first and second components through the system function model to determine a numeric state of function (SOF) of the system for each of $2^n-1$ possible repair cases, wherein the numeric SOF is 0 and 1 for a respective degraded and calibrated new system, such that the SOF degrades from 1 to 0 over time, and each of the $2^n-1$ possible repair cases describes a possible repair combination of the plurality of n components; and
   executing a control action when any of the numeric SOFs of the system is 0, including:
      calculating a repair cost and remaining useful life (RUL) for each of the $2^n-1$ possible repair cases via the host machine;
      calculating a ratio of the calculated repair cost and the calculated RUL for each of the $2^n-1$ possible repair cases via the host machine;
      calculating a cost-optimal repair case as the lowest of the calculated ratios from among the $2^n-1$ possible repair cases via the host machine; and
      performing the calculated cost-optimal repair case by replacing or repairing at least one of the plurality n of components.

2. The method of claim 1, further comprising recording a desired system life for the system, wherein calculating a cost-optimal repair case as the lowest of the calculated ratios from among the $2^n-1$ possible repair cases includes calculating a repair which is cost-optimal over the desired system life.

3. The method of claim 1, further comprising:
   recording the current and calibrated baseline performance signatures via a data recorder; and
   processing the current and calibrated baseline performance signatures via a host machine in remote communication with the data recorder.

4. The method of claim 1, wherein the system is a starter system of a vehicle, the first component is a starter motor, the second component is a battery, and the SOF is the cranking function of the starter system which includes the starter motor and the battery.

5. A method comprising:
   receiving, from a plurality of sensors via a host machine in communication with a vehicle cranking system having a plurality n of components, including a starter motor and a battery a current performance signature for the plurality n of components, wherein the host machine includes a processor and memory on which is recorded an aging model and a system function model;
   recording, via the host machine, a calibrated baseline performance signature for the starter motor and the battery;
   processing the current and calibrated baseline performance signatures through the aging model of a host machine to determine a future performance signature for each of the components;
   processing the future performance signatures for the starter motor and the battery through the system function model of the host machine to determine a numeric state of function (SOF) of the vehicle cranking system for each of $2^n-1$ possible repair cases, wherein the numeric SOF is 0 and 1 for a respective degraded and calibrated new system, such that the numeric SOF degrades to 0 over time, and wherein each of the possible $2^n-1$ repair cases describes a possible repair combination of the n components; and
   executing a control action when any of the numeric SOFs is 0, including:
      recording a desired system life for the vehicle cranking system;
      calculating, via the host machine, a repair cost and remaining useful life (RUL) for each of the $2^n-1$ possible repair cases;
      calculating, via the host machine, a ratio of the calculated repair cost and the calculated RUL for each of the $2^n-1$ possible repair cases;
      calculating, via the host machine, a cost-optimal repair case as the lowest of the calculated ratios from among the $2^n-1$ possible repair cases, including calculating, via the host machine, the cost-optimal repair case by calculating a repair which is cost-optimal over the recorded desired system life; and
      performing the calculated cost-optimal repair case by replacing or repairing at least one of the plurality n of components.

6. The method of claim 5, further comprising:
   recording the current and calibrated baseline performance signatures via a data recorder positioned aboard the vehicle;
   transmitting the current and calibrated baseline performance signatures to the host machine; and
   processing the current and calibrated baseline performance signatures via a host machine in remote communication with the data recorder.

7. The method of claim 5, wherein processing the current and calibrated baseline performance signatures through an aging model includes comparing the current and calibrated baseline performance signatures to a recorded trace of past performance values for a prior-fielded starter motor and battery.

\* \* \* \* \*